US012776619B2

(12) United States Patent
Ju et al.

(10) Patent No.: US 12,776,619 B2
(45) Date of Patent: Oct. 27, 2026

(54) SEMICONDUCTOR SIDE EMITTING LASER ON BOARD PACKAGE AND METHOD FORMING SAME

(71) Applicant: Excelitas Canada, Inc., Vaudreuil-Dorion (CA)

(72) Inventors: JinHan Ju, Kirkland (CA); Ralph Kig-I, Binan (PH); Frederic Laforce, Coteau-du-Lac (CA); Almar Palonpon, Laguna (PH)

(73) Assignee: Excelitas Canada, Inc., Vaudreuil-Dorion (CA)

( * ) Notice: Subject to any disclaimer, the term of this patent is extended or adjusted under 35 U.S.C. 154(b) by 712 days.

(21) Appl. No.: 18/310,967

(22) Filed: May 2, 2023

(65) Prior Publication Data

US 2023/0268711 A1 Aug. 24, 2023

Related U.S. Application Data

(63) Continuation of application No. PCT/US2021/057816, filed on Nov. 3, 2021.

(Continued)

(51) Int. Cl.

*H01S 5/02234* (2021.01)
*H01S 5/02257* (2021.01)

(Continued)

(52) U.S. Cl.

CPC ...... *H01S 5/02326* (2021.01); *H01S 5/02234* (2021.01); *H01S 5/02257* (2021.01); *H01S 5/028* (2013.01); *H01S 5/02345* (2021.01)

(58) Field of Classification Search

CPC ............. H01S 5/02326; H01S 5/02234; H01S 5/02257; H01S 5/028; H01S 5/02345; H01S 5/02208; H01S 5/0239; H01S 5/4031

See application file for complete search history.

(56) References Cited

U.S. PATENT DOCUMENTS 5,177,753 A * 1/1993 Tanaka ................. G02B 6/4212 257/E33.059
5,282,113 A * 1/1994 Kohama .......... G06K 19/07743 361/728

(Continued)

FOREIGN PATENT DOCUMENTS

WO WO 2020/107164 A1 6/2020

OTHER PUBLICATIONS

International Search Report and Written Opinion for International Application No. PCT/US2021/057816 mailed Mar. 2, 2022.

(Continued)

*Primary Examiner* — Xinning (Tom) Niu

(74) *Attorney, Agent, or Firm* — Wolf, Greenfield & Sacks, P.C.

(57) ABSTRACT

A chip-onboard assembly for a side-looking optical component is mounted on a mounting surface of a printed circuit board (PCB) and includes a window assembly mounted to the PCB. The window assembly includes a glass window and a window holding bracket. The bracket has a first walled portion, a second walled portion attached to the first walled portion, and a third walled portion opposite the second wall portion. The first walled portion further has a cutaway section configured to accommodate the glass window. An optical encapsulant covers the covering the side-looking optical component. The glass window is attached to the side-looking optical component CoB assembly.

19 Claims, 14 Drawing Sheets

Related U.S. Application Data

(60) Provisional application No. 63/109,451, filed on Nov. 4, 2020.

(51) Int. Cl.

| | |
|---|---|
| ***H01S 5/02326*** | (2021.01) |
| ***H01S 5/028*** | (2006.01) |
| *H01S 5/02345* | (2021.01) |

(56) References Cited

U.S. PATENT DOCUMENTS

| | | | | |
|---|---|---|---|---|
| 6,362,876 | B1 * | 3/2002 | Lai | H01S 5/02325 356/218 |
| 6,784,511 | B1 | 8/2004 | Kunihara et al. | |
| 2006/0067373 | A1 * | 3/2006 | Alander | H01S 5/4031 372/34 |
| 2011/0241549 | A1 * | 10/2011 | Wootton | F21S 8/006 257/E33.012 |
| 2015/0021330 | A1 * | 1/2015 | Ramesh | B23K 35/0222 228/56.3 |
| 2018/0254605 | A1 | 9/2018 | Wojcik et al. | |
| 2018/0261731 | A1 | 9/2018 | Wojcik et al. | |
| 2020/0144786 | A1 | 5/2020 | Godfrey | |

OTHER PUBLICATIONS

International Preliminary Report on Patentability for International Application No. PCT/US2021/057816 mailed May 19, 2023.

* cited by examiner

SEMICONDUCTOR SIDE EMITTING LASER ON BOARD PACKAGE AND METHOD FORMING SAME

CROSS-REFERENCE TO RELATED APPLICATIONS

This application claims priority under 35 U.S.C. § 120 to and is a continuation of International Application No. PCT/US2021/057816, filed Nov. 3, 2021, entitled "Semiconductor Side Emitting Laser on Board Package and Method Forming Same," which claims the benefit of U.S. Provisional Patent Application Ser. No. 63/109,451, filed Nov. 4, 2020, entitled "Packaging Semiconductor Side Emitting Laser on Board and Method Forming Same," each of which is incorporated by reference herein in its entirety.

FIELD OF THE INVENTION

The present invention relates to electronic components, and more particularly, is related to packaging for a semiconductor laser.

BACKGROUND

FIG. 1A show an example 100 of a side emitting laser chip (single laser or laser array) 120 mounted on printed circuit board (PCB) 110, along with laser driver circuit components 140. For laser on PCB and laser LLC (Laminated Leadless Carrier) packaging, the laser chip 120 is typically encapsulated with an encapsulating material 150, as shown by FIG. 1B. Laser light is emitted through a front surface 155 of the encapsulant 150. The front surface 155 is preferably smooth to provide a clean optical path for the laser, so the encapsulating material 150 must be either hard enough so the laser emitting surface ("front surface") 155 may be polished or must be casted to optical quality.

Typically, the encapsulation 150 is formed of hard epoxy using a dam and fill process. Uncured epoxy is applied over the laser array component 120. The epoxy material is soft enough to flow during application over the laser chip 120 upon the PCB 110. Typically, a two-step curing process is used to hold the location of the epoxy 150 to a desired portion of the PCB 110 and preventing the epoxy 150 from flowing elsewhere on the PCB 110 during an epoxy curing procedure. The first step of the two-step curing process uses ultraviolet (UV) cure epoxy 150 to perform an initial cure to partly solidify the epoxy 150 to fix (tack or hold) the epoxy 150 in shape, followed by a second step, for example a heat cure, to fully harden the epoxy 150. Here, the epoxy essentially sits over the laser chip as applied, informally referred to as a "glob top." After hardening, the light emitting side of the epoxy 150 is polished for better light transmission and light beam profile. Unfortunately, the polishable hard epoxy may create high stress in the laser chip 120.

In addition, the contaminants in the encapsulant, including the cure agent, may cause the degradation of the laser front facet in high temp and high humidity environment, eventually leading to degradation of the laser emitting front facet in conditions such as high temperatures (over 80C) and high humidity (over 80%).

Further, the existing hard epoxy surface cannot be coated with anti-reflection coating, so there is light reflection loss. In addition, use of polish-able hard epoxy 150 to encapsulate the laser chip 120 on the PCB 110 creates undesirable residual stress on the laser chip 120 and may degrade the chip performance and create delamination of the epoxy 150 from a front facet of the laser chip 120. Therefore, there is a need in the industry to address one or more of the abovementioned shortcomings.

SUMMARY

Embodiments of the present invention provide a packaging for a semiconductor side emitting laser on board and a method for forming same. Briefly described, the present invention relates to a chip-onboard window assembly for a side-looking optical component mounted on a mounting surface of a printed circuit board (PCB). The window assembly includes a glass window and a window holding bracket. The bracket has a first walled portion, a second walled portion attached to the first walled portion, and a third walled portion opposite the second wall portion. The first walled portion further has a cutaway section configured to accommodate the glass window. An optical encapsulant covers the side-looking optical component. The glass window is attached to the side-looking optical component CoB assembly.

Other systems, methods and features of the present invention will be or become apparent to one having ordinary skill in the art upon examining the following drawings and detailed description. It is intended that all such additional systems, methods, and features be included in this description, be within the scope of the present invention and protected by the accompanying claims.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principals of the invention.

DETAILED DESCRIPTION

Figure 1A:
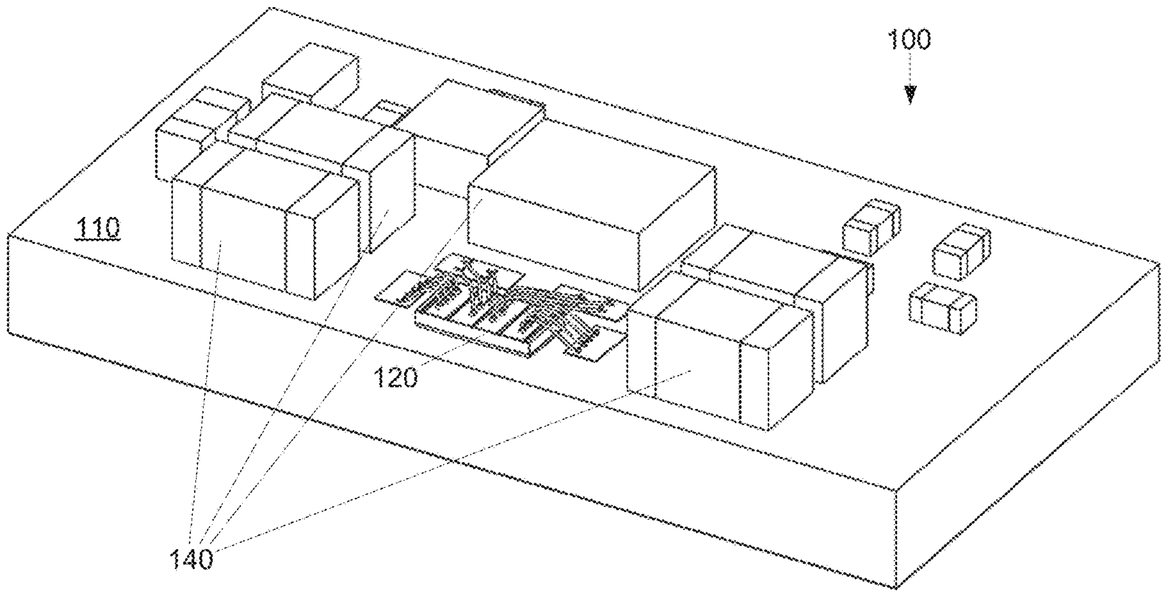
FIG. 1A (Prior Art)
FIG. 1A is a schematic diagram of a printed circuit board with an unencapsulated side emitting laser chip.

Reference will now be made in detail to embodiments of the present invention, examples of which are illustrated in the accompanying drawings. Wherever possible, the same reference numbers are used in the drawings and the description to refer to the same or like parts.

As used within this disclosure "substantially" means "very nearly," or within normal manufacturing tolerances. For example, two planar surfaces described as substantially parallel may deviate from being perfectly parallel by a small angle within normal manufacturing tolerances, for example, less than 1 degree.

Figure 2:
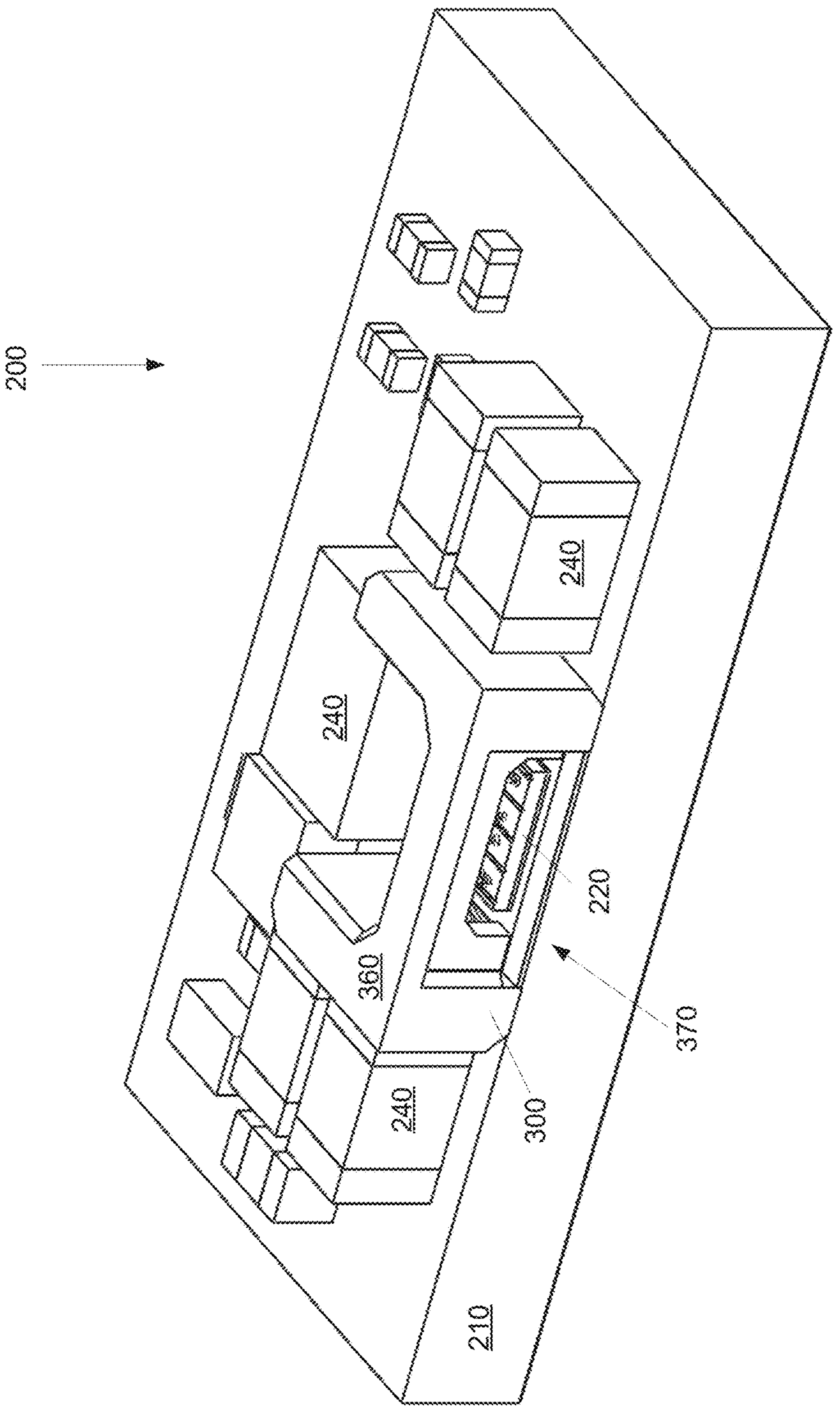
FIG. 2 is a schematic diagram of an exemplary first embodiment of a package for a PCB mounted side emitting laser.

FIG. 2 is a schematic diagram of an exemplary first embodiment 200 of a chip on board (CoB) package for a PCB mounted side emitting laser 220. Under the first embodiment, the side emitting laser 220 is at least partially surrounded by a glass window assembly 300. Additional circuit components 240 are mounted outside an inner perimeter of the glass window assembly 300.

Figure 3A:
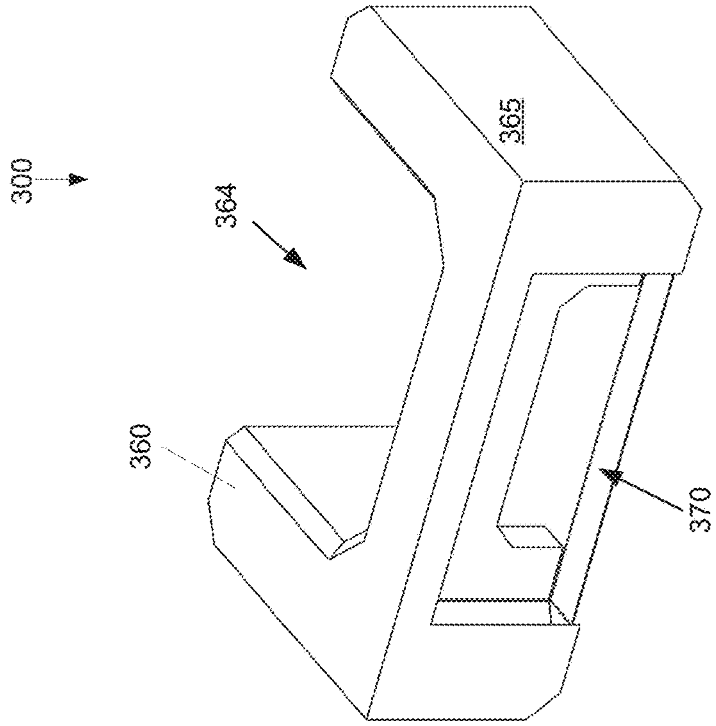
FIG. 3A is a schematic diagram detailing a glass window assembly of the package of FIG. 2.
Figure 3B:
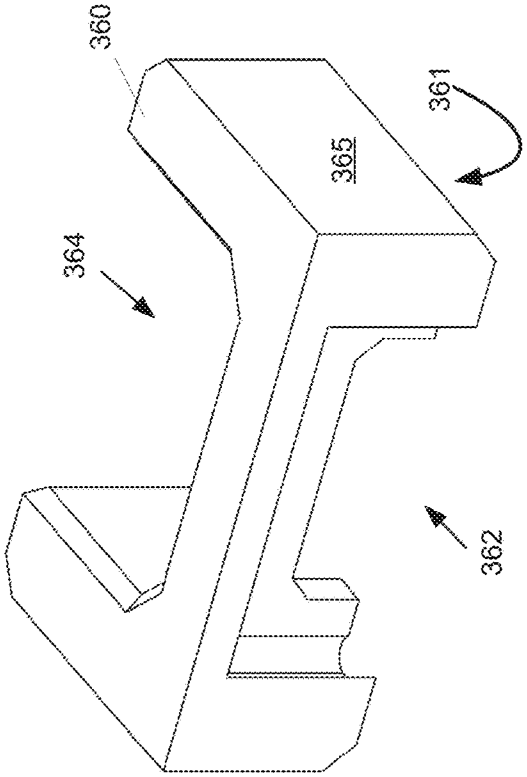
FIG. 3B is a schematic diagram showing of a bracket for the glass window assembly of FIG. 3A.
Figure 3C:
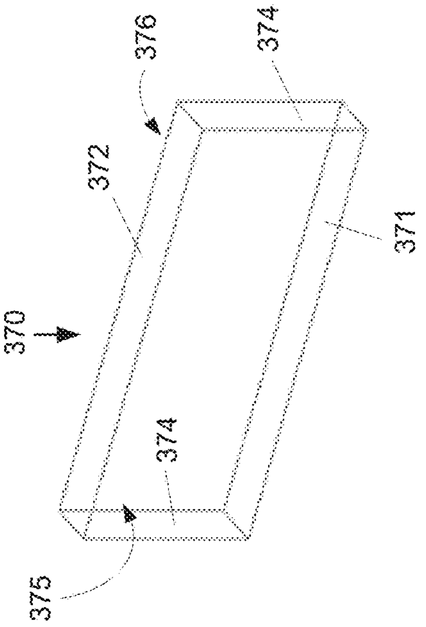
FIG. 3C is a schematic diagram showing of a glass piece for the glass window assembly of FIG. 3A.

As shown by FIGS. 3A-3C, the glass window assembly 300 includes a bracket portion 360 and a glass portion 370. The bracket portion 360 may be formed of, for example, plastic or ceramic. Under the first embodiment, the bracket 360 has three walls 365 in a generally U-shaped profile (when viewed from above in a plane parallel to the PCB 210 (FIG. 2)), where the walls, when mounted on the PCB 210, are oriented substantially normal to the PCB 210. A substantially flat base portion 361 of the bracket 360 is configured to be attached to the PCB 210. A frame opening 362, or cutaway section, is positioned in a wall of the bracket 360. The frame opening 362 is sized to accommodate the glass portion 370.

The glass 370 has a first planar surface 375 substantially parallel to a second planar surface 376. The first and second planar surfaces 375, 376 are bounded by a top edge 372 opposite a base edge 317, and two side edges 374. Under the first embodiment, the glass 370 is substantially rectangular in profile, although the glass 370 may have other shapes in alternative embodiments.

The glass 370 is affixed within the frame opening 362, for example, by a friction press fit (for example, within a V-groove in the bracket 360), or via an adhesive, such as epoxy. The glass 370 is disposed within the frame opening 362 of the bracket 360 such that the base edge 371 surface of the glass 370 is aligned with the bottom portion of the bracket 360, so that the glass window assembly 300 base is adjacent to the PCB 210 (FIG. 2). The glass 370 may have an anti-reflective coating applied to one or both planar surfaces 375, 376.

Other window arrangements are also possible. For example, in an alternative embodiment, the glass 370 may be affixed to an interior or exterior surface of the bracket 360 with an adhesive.

The glass 370 may be attached onto the laser chip on board (CoB) assembly, for example by epoxy, or by solder, for example, if the bracket bottom surface 361 is metalized and the PCB 210 metalized mounting pads to accommodate the glass window assembly 300. When the glass window assembly 300 is mounted to the PCB 210, the glass 370 and the bracket 360 are either sealed against the PCB 210 or are attached sufficiently close to the PCB 210 to contain a potting compound described further below.

To make an AR coated glass window in front of the laser emitting side (front facet) for Chip on Board (CoB) packaging, by attaching the glass window assembly 300 (consisting of the glass 370 and holding bracket 360) is mounted onto the PCB 210 with the side emitting laser 220 disposed inside the glass window assembly 300. The glass window assembly 300 and the side emitting laser 220 are arranged so the side emitting laser 220 emits a beam directed through the glass 370. The side emitting laser 220 is then potted to cover the side emitting laser 220 and any associated wire bonds with an optical encapsulant having of low stress and low contaminant properties.

As noted in the background section, previous laser packages used hard epoxy having high viscosity high hardness (Shore D>80) and a UV cure type with contaminants which cause degradation of the laser front facet in high temperature and/or high humidity environments. Since the first embodiment 200 includes a glass window 370, a potting compound (encapsulant) to encapsulate the side emitting laser 220 may use an encapsulant that need not be hard (for polishing) and/or UV curable with UV cure agents to contain flow, such as electrical joint compound (EJC) silicone, as the glass window assembly 300 serves to contain the potting compound in the vicinity of the side emitting laser 220.

Figure 4:
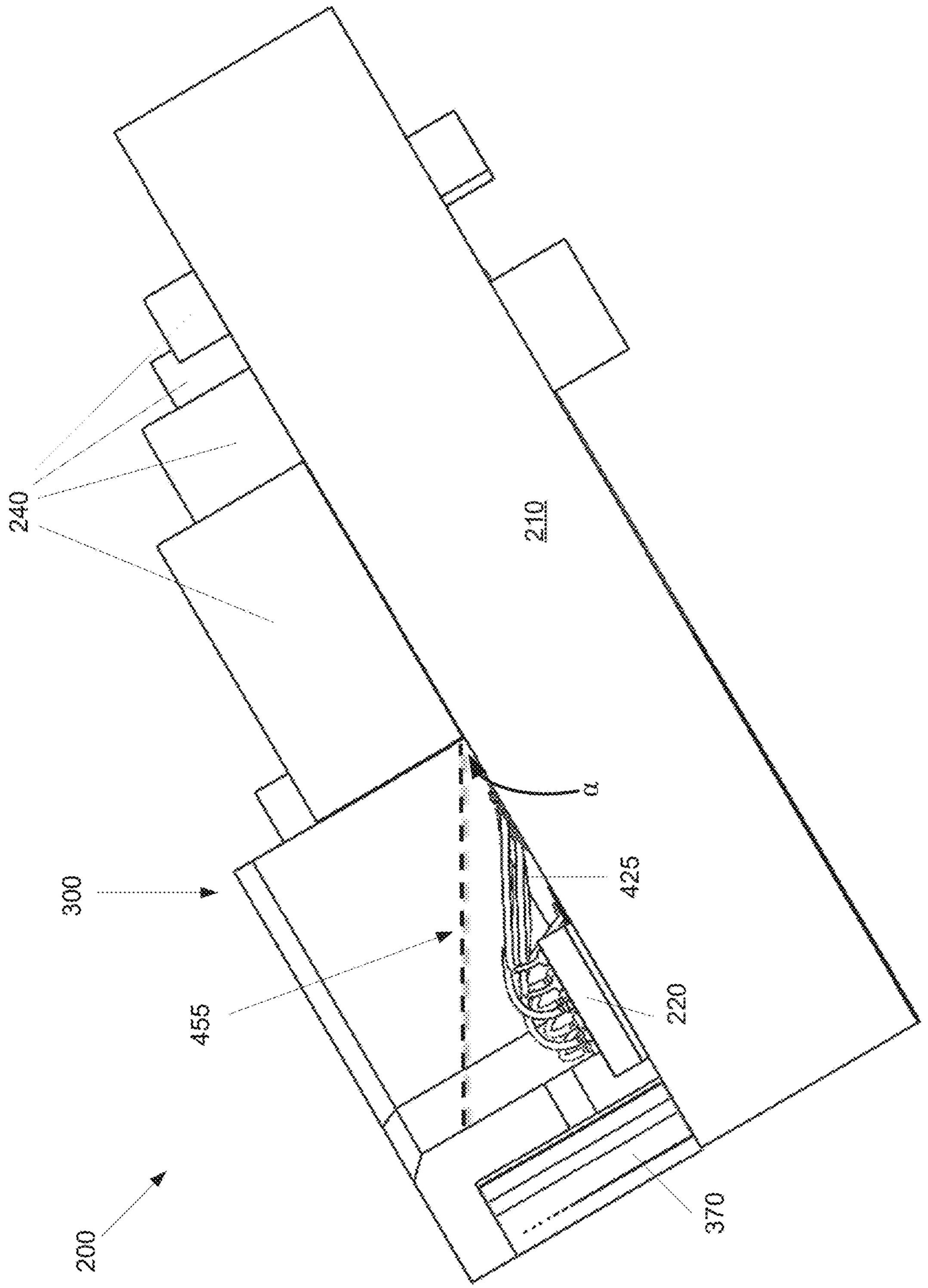
FIG. 4 is a schematic diagram showing a cutaway view of the package of FIG. 2.

Under the first embodiment, the glass window assembly 300 has an open back design, such that the glass window assembly 300 does not physically restrict flow of the potting compound 455 through a rear opening 364. As shown by FIG. 4, the potting compound 455 may be contained within the glass window assembly by applying the uncured potting compound 455 within the glass window assembly when a top planar surface of PCB 210 (that the glass window assembly 300 and the side emitting laser 220 are mounted to) is oriented at an angle during application and while the potting compound is cured. For a non-limiting example, the angle $\alpha$ may be in the range of 30° to 45°. After the potting compound is cured, the top surface of the potting compound 455 (shown as a dashed line in FIG. 4) is oriented at the angle $\alpha$ with respect to the top planar surface of the PCB 210.

Figure 1B:
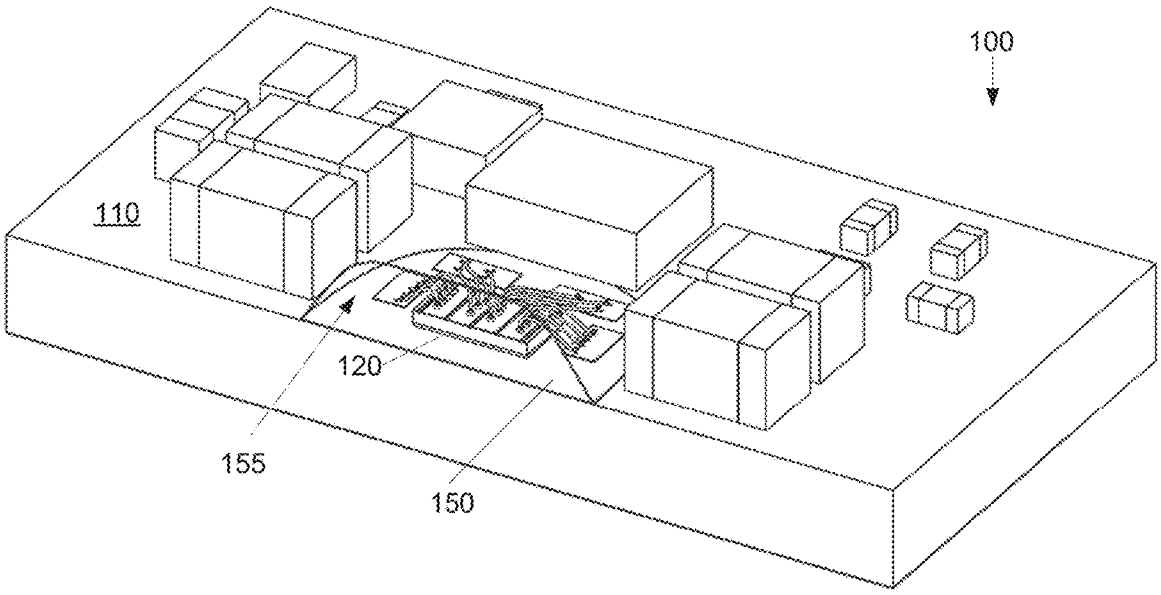
FIG. 1B (Prior Art)
FIG. 1B is a schematic diagram the printed circuit board of FIG. 1B an encapsulated side emitting laser chip.

Table 1 shows a comparison between a previous "glob top" laser assembly (FIG. 1B) and the first embodiment (FIG. 2) having a glass window.

TABLE 1

Comparison of first embodiment with previous approaches

| | Existing "Glob Top" | Glass Window |
|---|---|---|
| Material Selection | Epoxy: UV cure + heat cure: may have ionic contaminations. | EJC silicone or epoxy: 'clean' version and heat cure only |
| Mechanical property | Hard (for polishing) | Soft (new material Shore A hardness 30, low residual stress, no polishing cost, no polishing yield loss, no polishing stress) |
| Optical performance | Light transmission loss from epoxy to air (AR coating not possible on epoxy surface) | AR coated window (lower light loss, higher efficiency) |
| Quality and Reliability | | Higher optical power output (with AR coated window), longer laser working lifetime (with lower stress), more stable performance in high temperature and high humidity environment |

Figure 5:
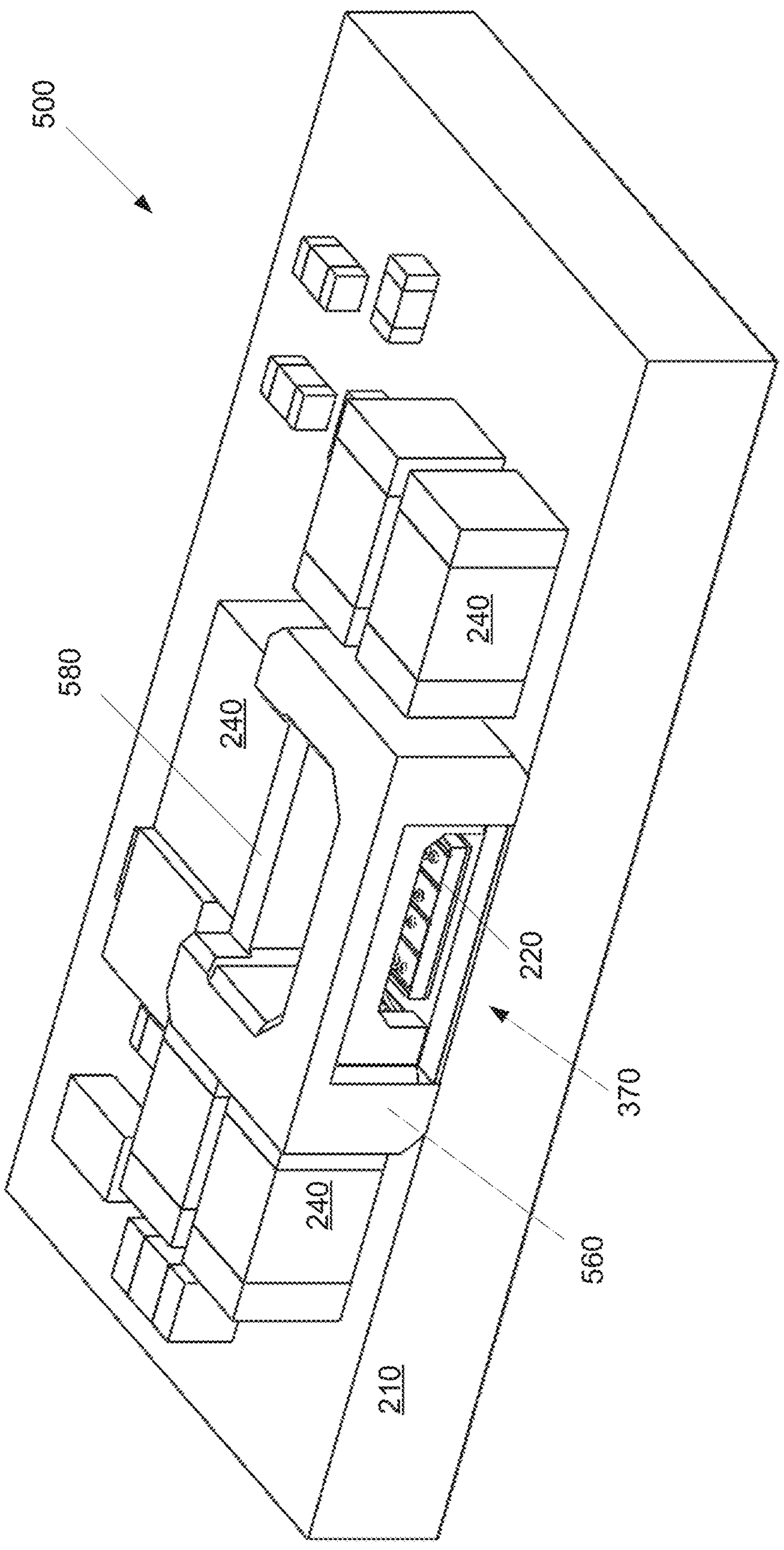
FIG. 5 is a schematic diagram of an exemplary second embodiment of a package for a PCB mounted side emitting laser.

Under a second embodiment 500, as shown by FIG. 5, a surrounding glass window assembly 560 includes a back wall 580 entirely surrounding the laser chip 220, so the potting compound may be applied over the laser chip 220 such that the potting compound is constrained from flowing outside the surrounding window glass assembly. Under the second embodiment, the potting compound may be applied without inclining the PCB 210 with respect to horizontal.

The first embodiment may be preferable when external components 240, for example, MOSFET, capacitors, and/or resistors are sufficiently close to the laser chip 220 so there is not room for a closed holder. When the components 240 (MOSFET, capacitors and resistors) surrounding the laser chip have room for a closed holder, the optical encapsulant may be filled as usual from the top to fill the holder to cover the laser chip 220 and wire bonds without tilting the CoB, such that the surface of the optical encapsulant is substantially parallel to the PCB 210.

Figure 6:
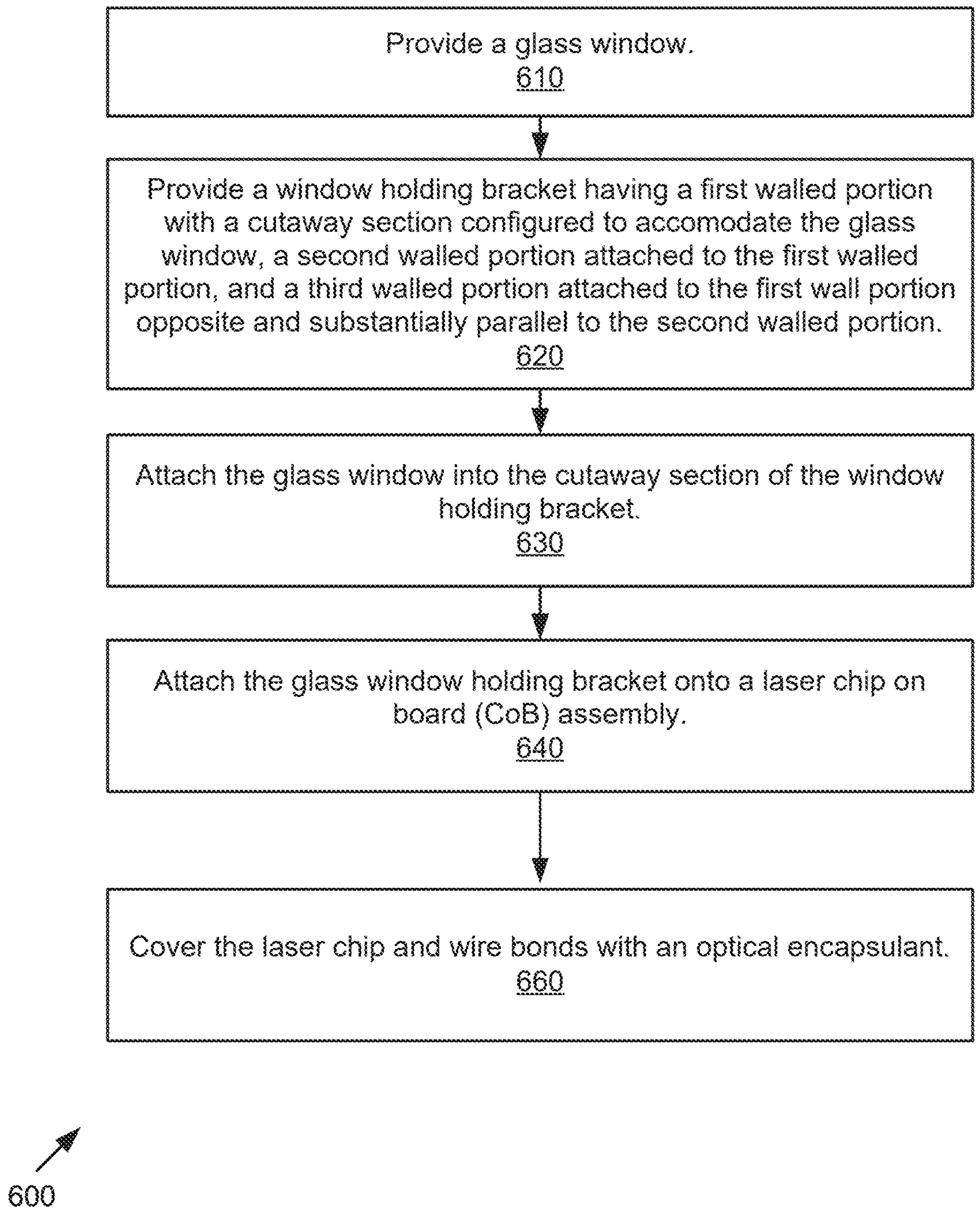
FIG. 6 is a flowchart of an exemplary method for forming a package for a PCB mounted side emitting laser.

FIG. 6 is a flowchart of an exemplary method for encapsulating a side-looking optical component mounted on a sub-portion of a printed circuit board (PCB) of a chip-onboard (CoB) assembly. It should be noted that any process descriptions or blocks in flowcharts should be understood as representing modules, segments, portions of code, or steps that include one or more instructions for implementing specific logical functions in the process, and alternative implementations are included within the scope of the present invention in which functions may be executed out of order from that shown or discussed, including substantially concurrently or in reverse order, depending on the functionality involved, as would be understood by those reasonably skilled in the art of the present invention. The method is described with reference to FIGS. 2 and 3.

A glass window 370 is provided, as shown by block 610. A window holding bracket 360 is provided, as shown by block 620. The holding bracket includes three walled portions 365: a first walled portion, a second walled portion attached to the first walled portion, and a third walled portion attached to the first wall portion opposite and substantially parallel to the second walled portion. The first walled portion has a cutaway section 362 configured to accommodate the glass window 370.

The glass window 370 is attached into the cutaway section 362 of the window holding bracket 360, as shown by block 630. The glass window holding bracket 360 is attached to the PCB 210, as shown by block 640. The laser chip 220 and wire bonds 425 (FIG. 4) are covered with an optical encapsulant 455 (FIG. 4), as shown by block 660.

While the first embodiment describes inserting the glass window 370 to the cutaway of bracket 360, in a third embodiment 700 the glass 370 may be affixed to the bracket 700 in other ways. For example, the glass window 370 may be attached to an outer surface of the bracket 760.

Figure 7A:
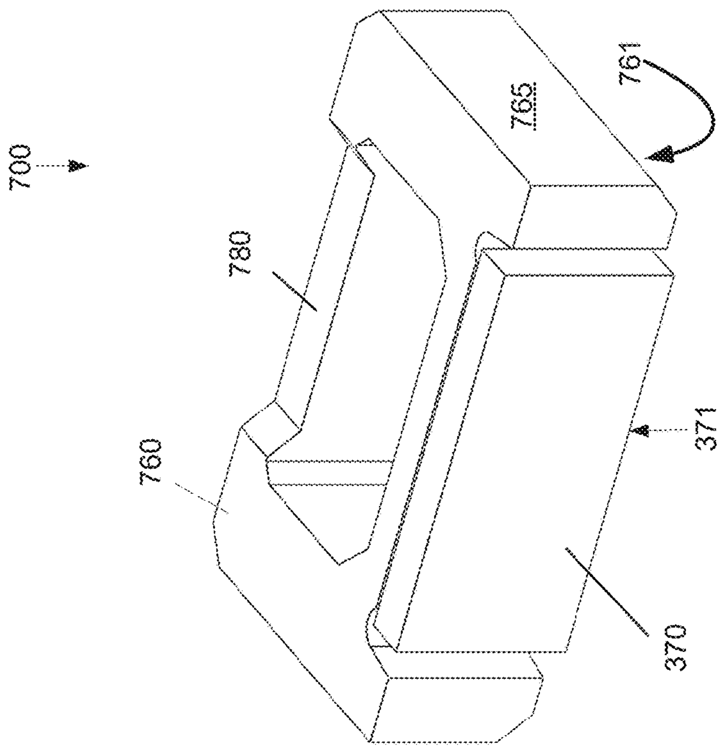
FIG. 7A is a schematic diagram detailing a third embodiment of a glass window assembly.
Figure 7B:
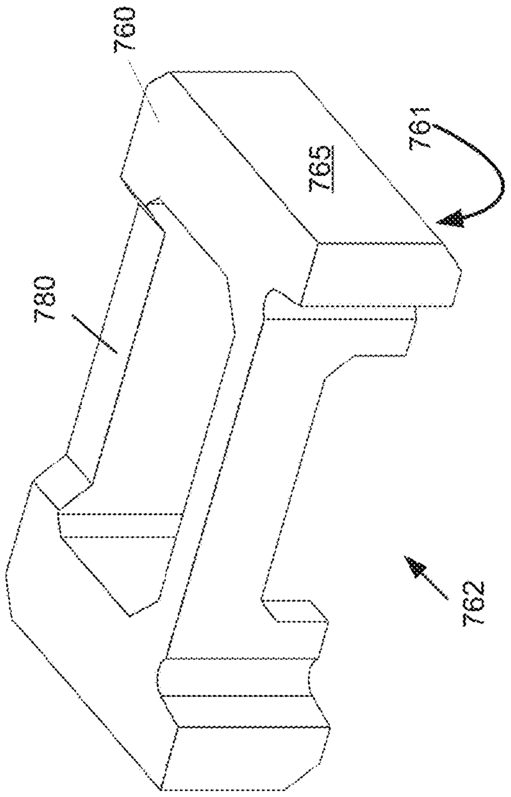
FIG. 7B is a schematic diagram showing of a bracket for the glass window assembly of FIG. 7A.
Figure 7C:
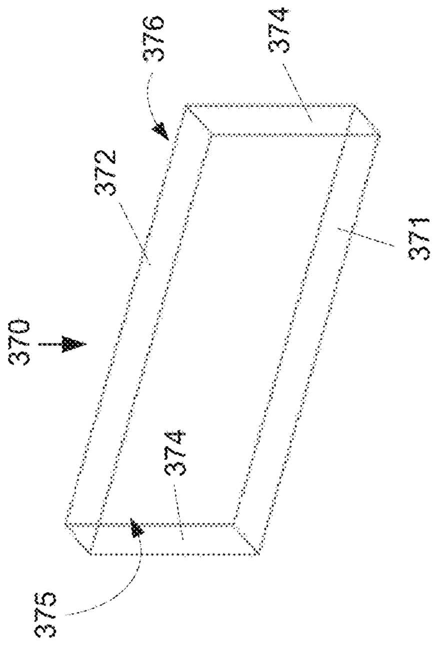
FIG. 7C is a schematic diagram showing of a glass piece for the glass window assembly of FIG. 7A.
Figure 8A:
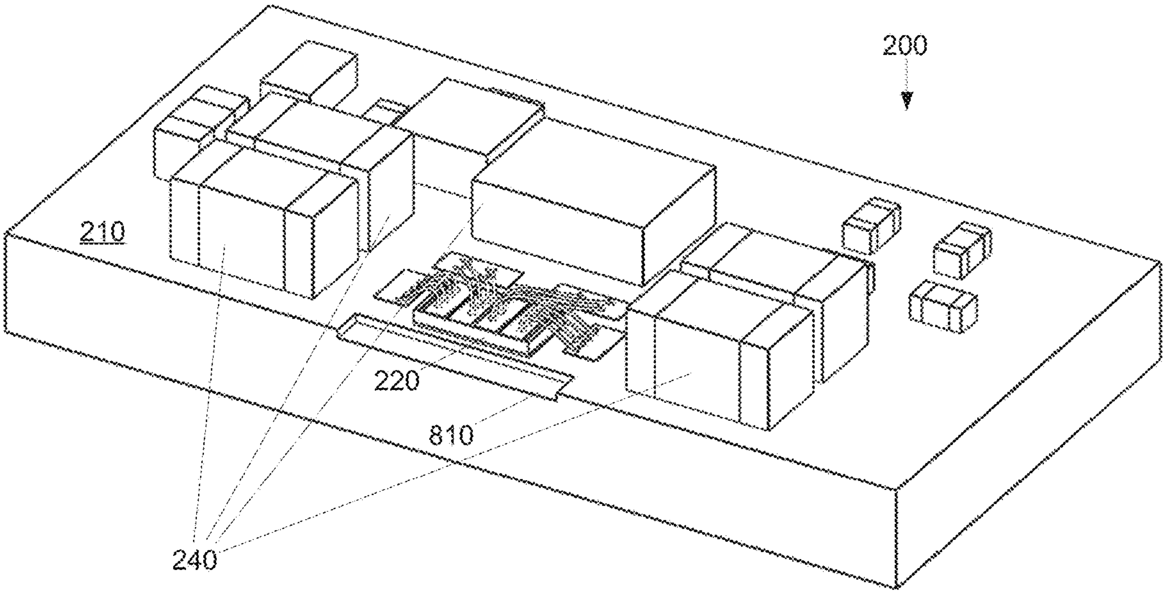
FIG. 8A is a schematic diagram of an exemplary PCB with a glass recess area for mounting a third embodiment of a package for a PCB mounted side emitting laser.
Figure 8B:
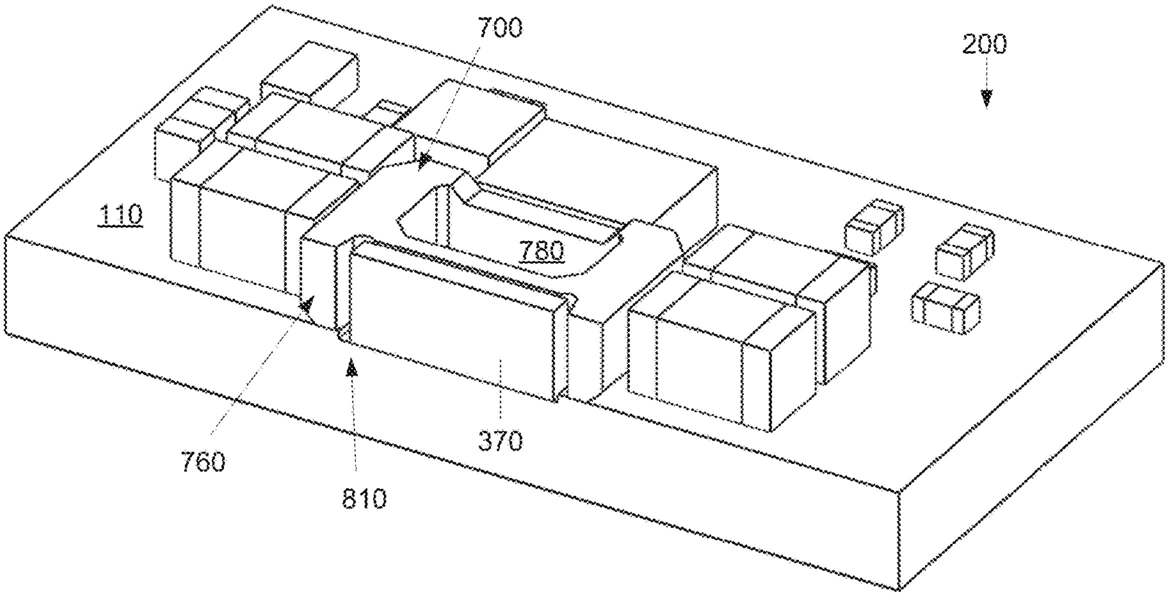
FIG. 8B is a schematic diagram from a perspective view of the third exemplary embodiment package for a PCB mounted side emitting laser with an optional back wall.

As shown by FIGS. 7A-7C, the glass window assembly 300 includes a bracket portion 760 and a glass portion 370. The bracket portion 760 may be formed of, for example, plastic or ceramic. Under the third embodiment, the bracket 760 has three walls 765 in a generally U-shaped profile (when viewed from above in a plane parallel to the PCB 210 (FIG. 2)), where the walls, when mounted on the PCB 210, are oriented substantially normal to the PCB 210. A substantially flat base portion 761 of the bracket 760 is configured to be attached to the PCB 210. A frame opening 762, or cutaway section, is positioned in a front wall of the bracket 760. The front wall of the bracket 760 is configured to receive the glass portion 370 so the glass portion is attached, for example with an adhesive, to cover the frame opening 762. As shown by FIG. 8A, the PCB 210 may include a recessed portion 810 sized to accommodate a base edge 371 of the window 370 extending below the base portion 761 of the bracket 760.

Figure 8C:
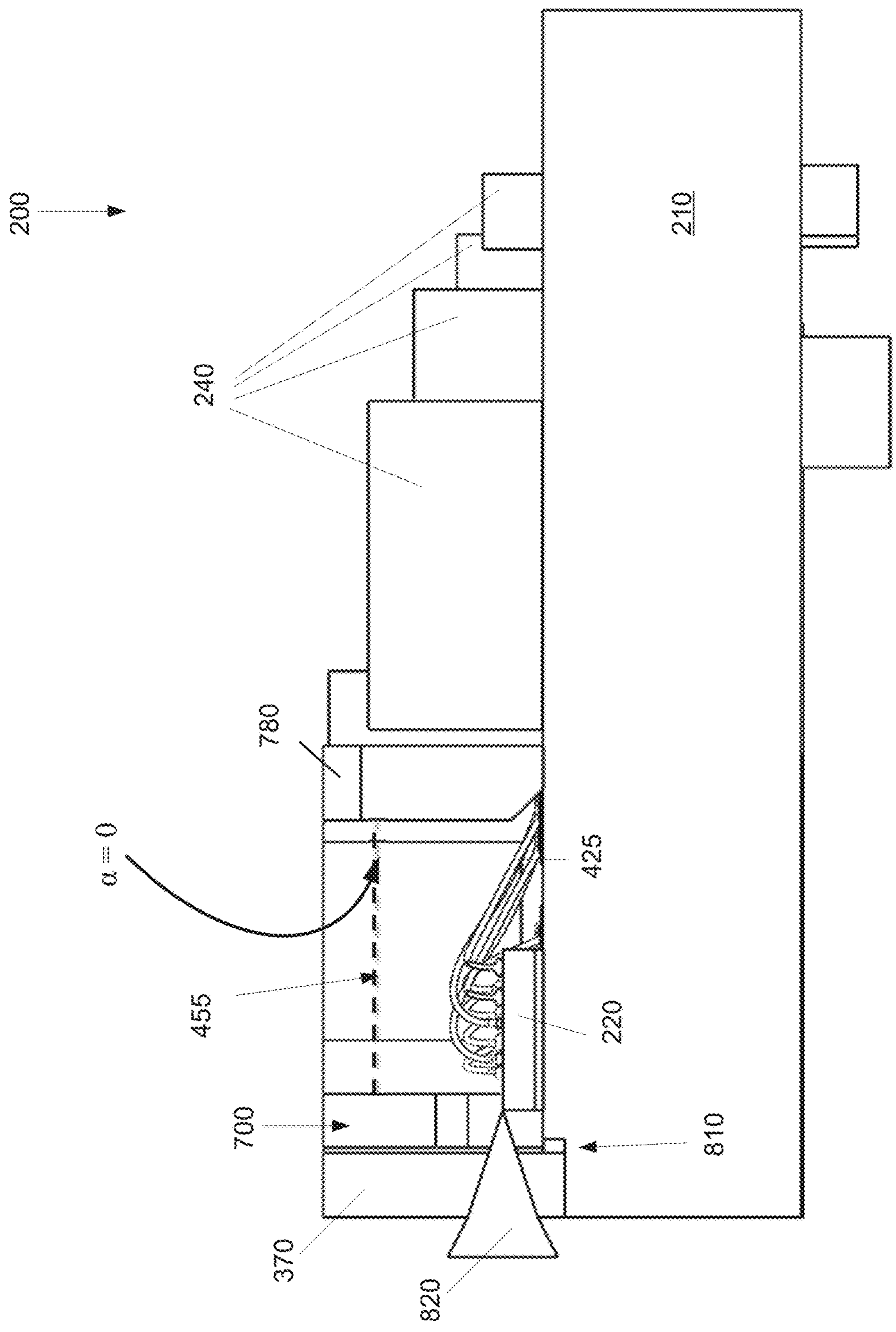
FIG. 8C is a cutaway side view of the third exemplary embodiment of FIG. 8B.

Under the third embodiment 700, as shown by FIGS. 7A-7B, and 8B-C, the glass window assembly 700 may optionally include a (fourth) back wall 780 to entire surrounding the laser chip 220, so the potting compound may be applied over the laser chip 220 and wire bonds 425 such that the potting compound is constrained from flowing outside the surrounding window glass assembly 700. When the layout of components provides sufficient room for the optional back wall 780 is omitted from the bracket 760, as shown by FIG. 8A the potting compound 455 may be applied over the laser chip 220 and wire bonds 425 without inclining the PCB 210 with respect to horizontal (board incline angle $\alpha=0$, as shown by FIG. 8C). Since the glass window assembly 700 surrounds the laser chip 220, the potting compound 455 is constrained from flowing outside the surrounding window glass assembly 700. Light 820 emitted from the laser chip 220 passes through the window 370.

Figure 9A:
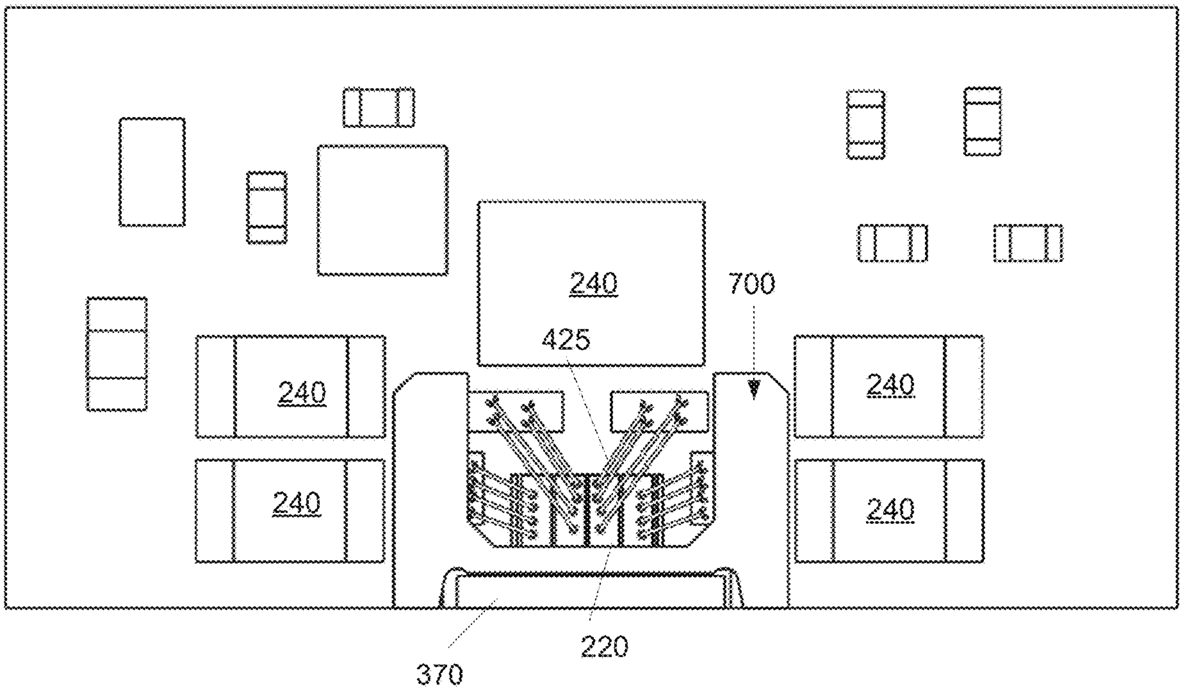
FIG. 9A is a schematic diagram from a top view of the third exemplary embodiment package for a PCB mounted side emitting laser omitting the optional back wall.
Figure 9B:
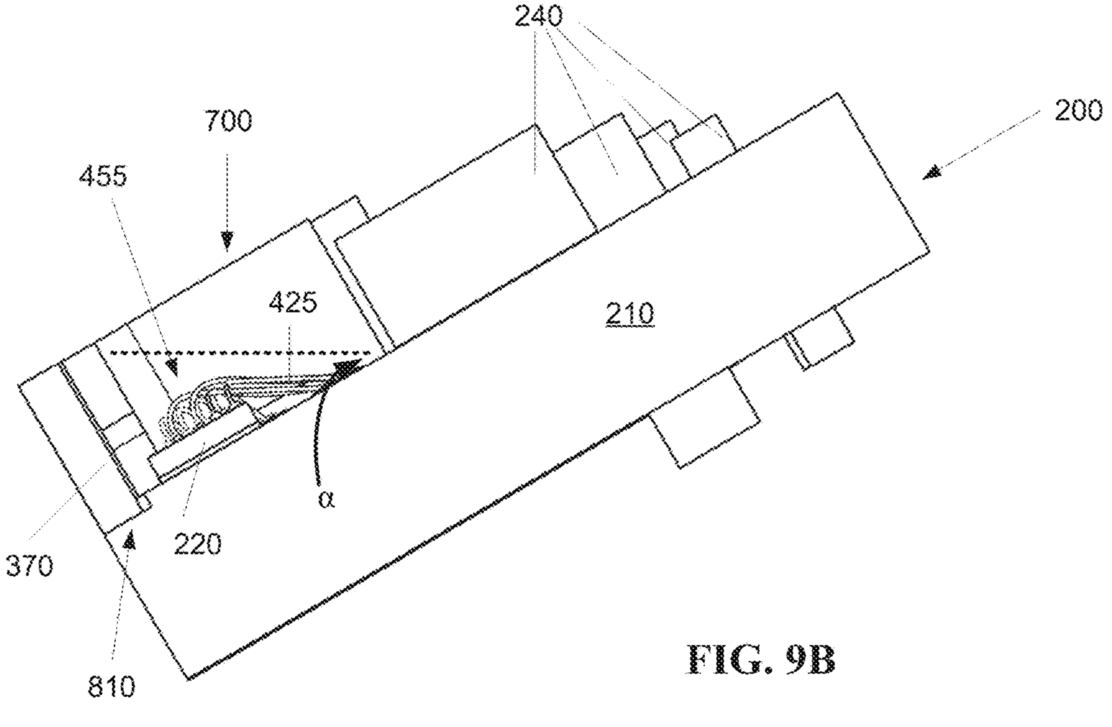
FIG. 9B is a cutaway side view of the third exemplary embodiment of FIG. 9A.

When the layout of components does not provide sufficient room, the optional back wall 780 may be omitted from the window glass assembly 700, as shown by FIG. 9A. As shown by FIG. 9B, the potting compound 455 may be applied over the laser chip 220 and wire bonds 425 by inclining the PCB 210 with respect to horizontal (with a board incline angle $\alpha$ in a range of, for example,) 25°-50°. After the potting compound 455 has cured, the PCB 210 may be returned to a horizontal orientation and the potting compound 455 remains substantially within the window glass assembly 700.

Under the third embodiment 700, the bracket 760 may attached to the PCB 210 without the glass window 97, where the glass window 370 is attached to the PCB 210 and/or the bracket 760 after the bracket 760 has been attached to the PCB 210. The glass window 370 may be attached to the PCB 210 and/or the bracket 760, for example, by an adhesive.

Figure 10:
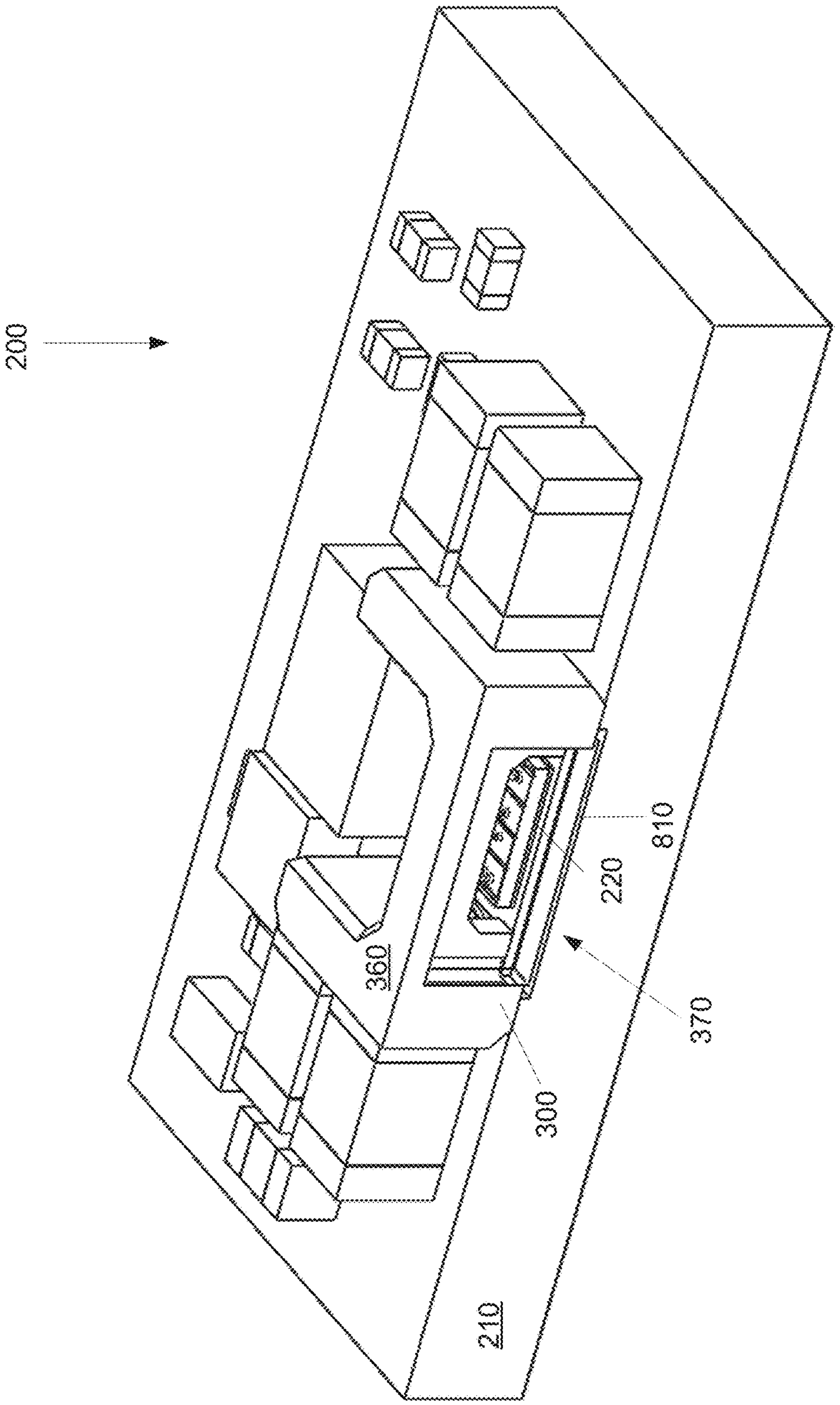
FIG. 10 is a schematic diagram of an exemplary alternative embodiment of a package for a PCB mounted side emitting laser.
Figure 11A:
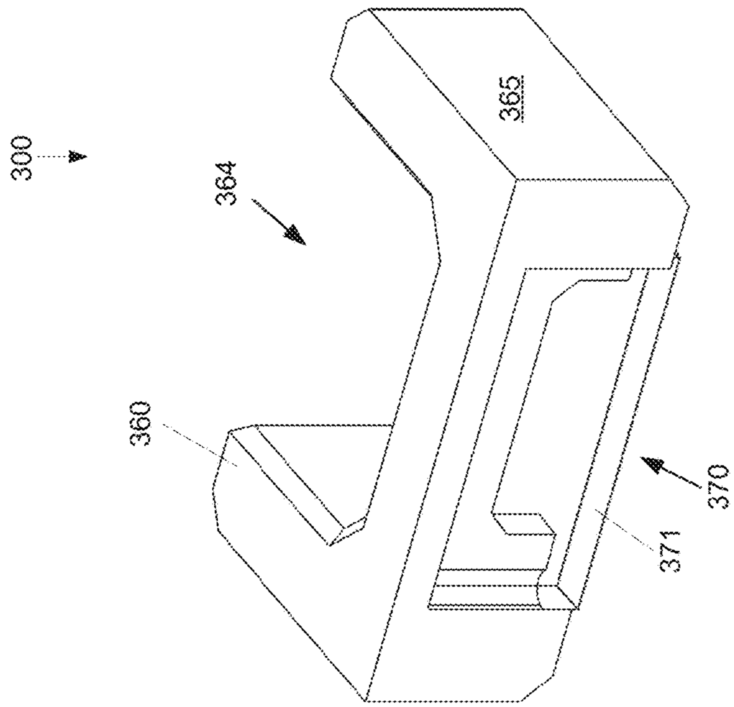
FIG. 11A is a schematic diagram detailing a glass window assembly of the package of FIG. 10.
Figure 11B:
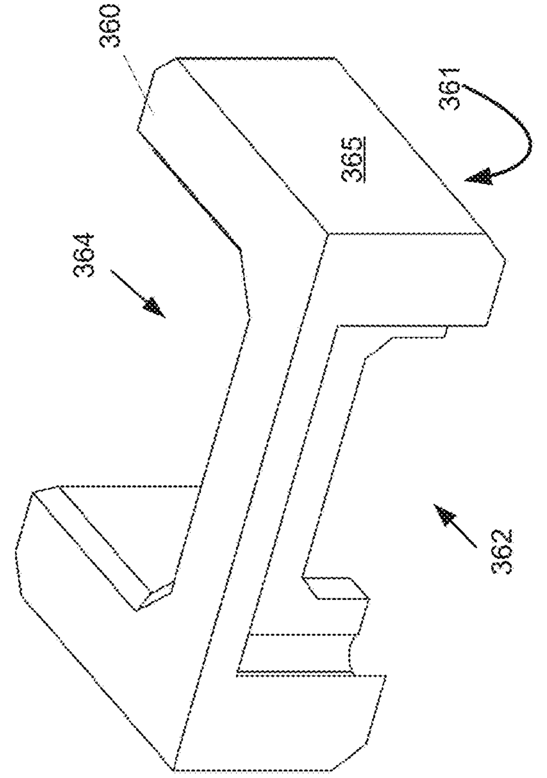
FIG. 11B is a schematic diagram showing of a bracket for the glass window assembly of FIG. 11A.
Figure 11C:
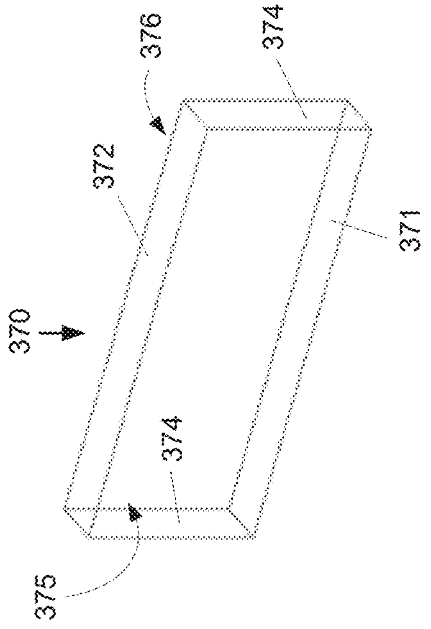
FIG. 11C is a schematic diagram showing of a glass piece for the glass window assembly of FIG. 11A.
Figure 12:
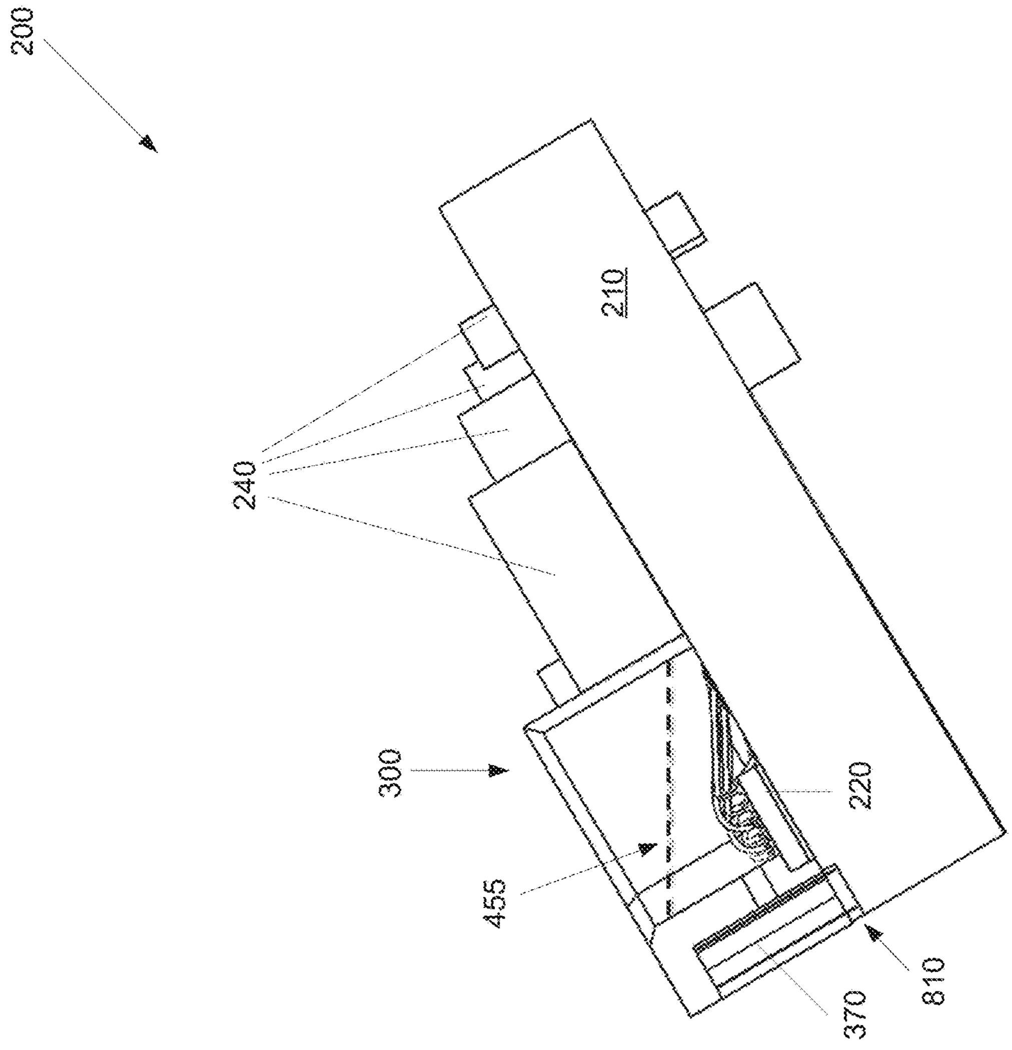
FIG. 12 is a schematic diagram showing a cutaway view of the package of FIG. 10.
Figure 13:
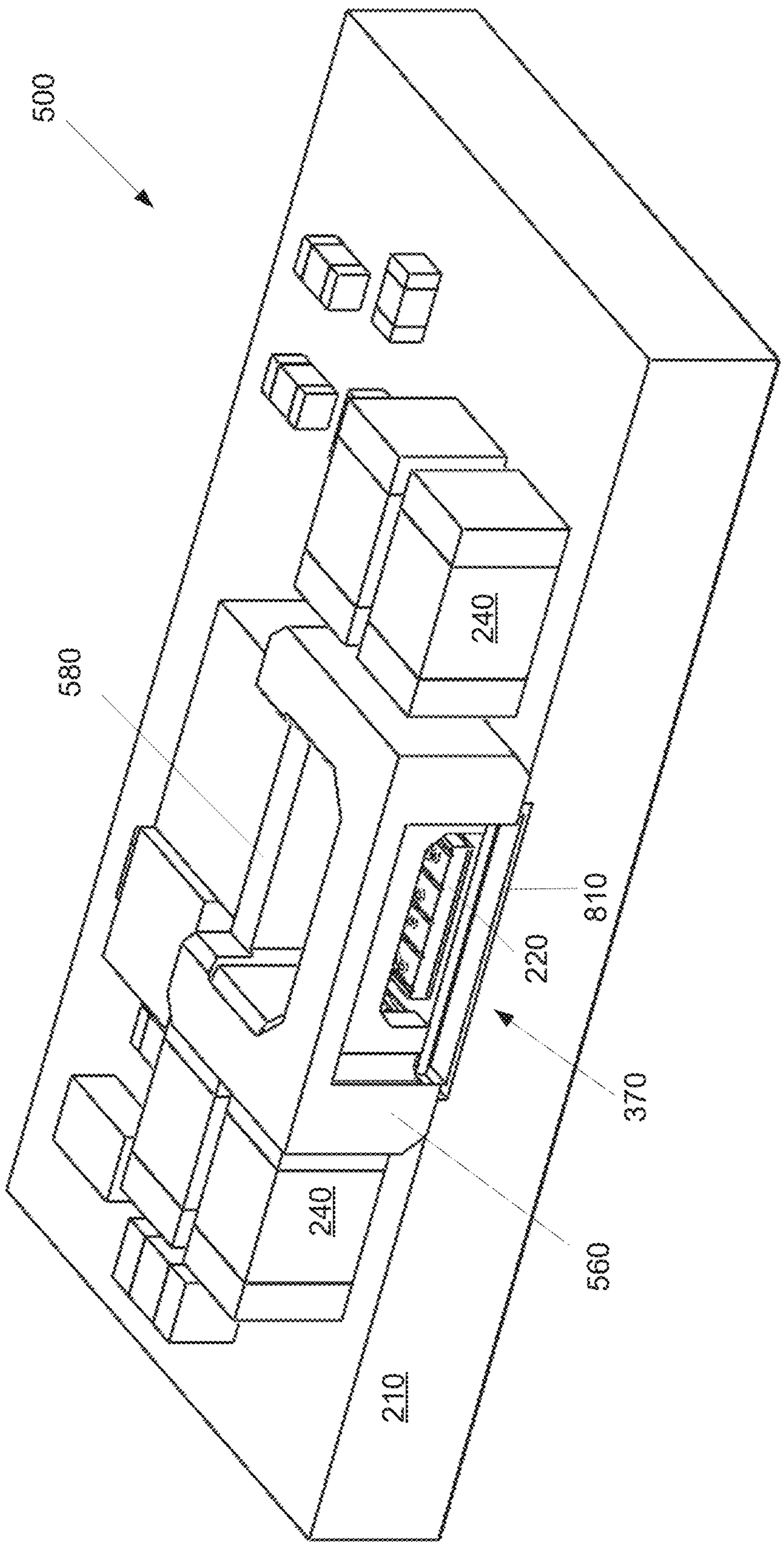
FIG. 13 is a schematic diagram of a variation of the package of FIG. 5 with the window extending below the bracket into a recess on the PCB.

Other variations are also possible. For example, FIGS. 10-12 show an alternative embodiment based on the first embodiment where the window 370 is inset into the bracket 360, and the base of the window 370 is extended below the floor of the bracket 360 into a recess 810 in the PCB 210. FIG. 13 shows a variation of the package of FIG. 5 with the window extending below the bracket into a recess on the PCB.

It should be noted that while the above embodiments are directed to a package for a side emitting laser chip and/or array, in alternative embodiments the package may instead or in addition accommodate other side-looking optical components, such as sensors or detectors.

In summary, it will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for encapsulating a side-looking optical component mounted on a sub-portion of a printed circuit board (PCB) of a chip-onboard (CoB) assembly, comprising the steps of:
- providing a glass window;
- providing a window holding bracket comprising a first walled portion, a second walled portion attached to the first walled portion, and a third walled portion opposite the second walled portion attached to the first walled portion, the first walled portion further comprising a cutaway section configured to accommodate the glass window;
- attaching the glass window to the window holding bracket to cover and/or fill the cutaway section of the first walled portion;
- affixing the window holding bracket to the PCB of the CoB assembly so the side-looking optical component is adjacent to the first walled portion and between the second and third walled portions; and
- after affixing the window holding bracket to the PCB, applying an optical encapsulant to cover the side-looking optical component.

2. The method of claim 1, wherein the optical encapsulant comprises a shore A hardness of about 30.

3. The method of claim 1, wherein the optical encapsulant does not include an ultra-violet curing agent and/or ionic contaminants.

4. The method of claim 1, further comprising the step of applying an anti-reflective coating applied to at least one surface of the glass window.

5. The method of claim 1, wherein the optical encapsulant fills a gap between the side-looking optical component and the glass window.

6. The method of claim 1, further comprising the step of arranging the CoB assembly at an angle $\alpha$ with respect to horizontal prior to applying the optical encapsulant.

7. The method of claim 6, wherein the angle $\alpha$ is in the range of 30° to 45°.

8. The method of claim 1, wherein the window holding bracket further comprises a fourth walled portion disposed opposite and substantially parallel to the first walled portion and attached to the second walled portion and the third walled portion.

9. The method of claim 1, wherein the side-looking optical component comprises a laser chip.

10. The method of claim 1, further comprising the step of providing a recess in the PCB to accommodate the glass window.

11. The method of claim 1, wherein the third walled portion is arranged substantially parallel to the second walled portion.

12. A chip-onboard (CoB) assembly for a side-looking optical component mounted on a mounting surface of a printed circuit board (PCB), comprising:
- a glass window assembly mounted to the PCB, further comprising:
  - a glass window; and
  - a window holding bracket comprising a first walled portion, a second walled portion attached to the first walled portion, and a third walled portion opposite the second walled portion attached to the first walled portion, the first walled portion further comprising a portion configured to accommodate the glass window; and
- an optical encapsulant covering the side-looking optical component,
- wherein a base portion of the glass window is disposed upon a PCB surface, and the optical encapsulant fills a gap between the side-looking optical component and glass window.

13. The CoB assembly of claim 12, wherein the optical encapsulant does not include an ultra-violet curing agent, and the optical encapsulant comprises a shore A hardness of about 30.

14. The CoB assembly of claim 12, wherein at least one surface of the glass window comprises an anti-reflective coating.

15. The CoB assembly of claim 12, wherein a top surface of the optical encapsulant is oriented at an angle $\alpha$ in a range of 30° to 45° with respect to a planar mounting surface of the PCB.

16. The CoB assembly of claim 12, wherein the window holding bracket further comprises a fourth walled portion disposed opposite and substantially parallel to the first walled portion and attached to the second walled portion and the third walled portion.

17. The CoB assembly of claim 16, wherein the optical encapsulant is confined within a region on the PCB bounded by the first, second, third, and fourth walled portions.

18. The CoB assembly of claim 12, wherein the PCB comprises a recess configured to accommodate the base portion of the glass window.

19. The CoB assembly of claim 12, wherein the third walled portion is arranged substantially parallel to the second walled portion.

* * * * *